(12) United States Patent
Lin

(10) Patent No.: US 12,010,808 B2
(45) Date of Patent: Jun. 11, 2024

(54) FPC/FFC TENSION KEEPING DEVICE AND ELECTRONIC APPARATUS HAVING THE SAME

(71) Applicant: FOSITEK CORPORATION, New Taipei (TW)

(72) Inventor: Wen-Yen Lin, New Taipei (TW)

(73) Assignee: FOSITEK CORPORATION, New Taipei (TW)

( * ) Notice: Subject to any disclaimer, the term of this patent is extended or adjusted under 35 U.S.C. 154(b) by 67 days.

(21) Appl. No.: 18/078,674

(22) Filed: Dec. 9, 2022

(65) Prior Publication Data

US 2024/0138083 A1 Apr. 25, 2024

(30) Foreign Application Priority Data

Oct. 25, 2022 (TW) .................................. 111140487

(51) Int. Cl.
*H05K 7/00* (2006.01)
*G06F 1/16* (2006.01)
*H05K 1/02* (2006.01)
*H05K 7/14* (2006.01)

(52) U.S. Cl.
CPC ......... *H05K 7/1422* (2013.01); *G06F 1/1679* (2013.01); *G06F 1/1681* (2013.01); *H05K 1/0277* (2013.01)

(58) Field of Classification Search
CPC .... H05K 7/1422; H05K 1/027; G06F 1/1679; G06F 1/1681
See application file for complete search history.

(56) References Cited

U.S. PATENT DOCUMENTS

| | | | |
|---|---|---|---|
| 10,747,269 B1* | 8/2020 | Choi | H04M 1/0237 |
| 2018/0210497 A1* | 7/2018 | Lin | E05D 3/06 |
| 2021/0034117 A1* | 2/2021 | Torres | G06F 1/1616 |

* cited by examiner

*Primary Examiner* — Pete T Lee
(74) *Attorney, Agent, or Firm* — Birch, Stewart, Kolasch & Birch, LLP

(57) ABSTRACT

An FPC/FFC tension keeping device is adapted to be mounted to an electronic apparatus, and includes a tension keeping unit that includes a base seat module and a sliding module. The base seat module includes a base seat and two guide members. The base seat has two guiding slots. The guide members are respectively inserted in the guiding slots and fixedly connected to the base seat. The sliding module includes a sliding member and two resilient members. The sliding member is slidably connected to the guide members. The resilient members are respectively disposed in the two guiding slots and are respectively sleeved on the guide members. The resilient members are configured to maintain, during movement of the sliding member, contact between the sliding member and an FPC/FFC board of the electronic apparatus that wraps around the sliding member, and to conserve tension of the FPC/FFC board.

10 Claims, 9 Drawing Sheets

FPC/FFC TENSION KEEPING DEVICE AND ELECTRONIC APPARATUS HAVING THE SAME

CROSS-REFERENCE TO RELATED APPLICATION

This application claims priority to Taiwanese Invention Patent Application No. 111140487, filed on Oct. 25, 2022.

FIELD

The disclosure relates to a tension keeping device, and more particularly to an FPC/FFC tension keeping device and an electronic apparatus having the same.

BACKGROUND

A conventional electronic equipment (such as a notebook computer) has a first device part and a second device part that can be opened or closed relative to each other. An electric cable electrically connects electronic components in the first device part with electronic components in the second device part. However, in the conventional electronic equipment, a section of the electric cable may be exposed through a gap between the first device part and the second device part. One way to overcome this situation is to use a flexible flat cable (FFC) or a flexible printed circuit (FPC) to electrically connect the electronic components of the first device part with the electronic components of the second device parts. This can save space compared to the electric cable since the electric cable is much thicker than either the FFC or FPC. Meanwhile, a flexible sheath module may be used to protect a section of the FFC/FPC that is exposed between the first device part and the second device part. This setup saves space compared to the electric cable setup, since a specialized hinge that allows the electric cable to pass through and connect the first and second device parts may be omitted; therefore, the conventional electronic equipment using the FFC/FPC connection may be made much thinner. However, the flexible sheath module used in the FFC/FPC connection has a complex structure and is difficult to assemble and manufacture. Additionally, an axle and a flexible cover that are used in the flexible sheath module are made of costly materials, resulting in relatively high manufacturing costs.

SUMMARY

Therefore, an object of the disclosure is to provide a FPC/FFC tension keeping device that can alleviate at least one of the drawbacks of the prior art.

According to the disclosure, the FPC/FFC tension keeping device is adapted to be mounted to an electronic apparatus. The electronic apparatus includes a first device part, a second device part that is rotatably connected to the first device part, and a first FPC/FFC board. The first FPC/FFC board has two opposite first and second ends that are respectively located within the first device part and the second device part. The FPC/FFC tension keeping device includes at least one tension keeping unit that includes a base seat module and a sliding module. The base seat module includes a base seat and two guide members. The base seat has a first surface, a second surface that is opposite to the first surface, and two guiding slots that extends in a first direction. The two guide members are respectively inserted in the guiding slots and fixedly connected to the base seat. The sliding module includes a sliding member and two resilient members. The sliding member is elongated in a second direction that is perpendicular to the first direction, is connected to the guide members, and is slidable along an axis that extends in the first direction. The two resilient members are respectively disposed in the two guiding slots and are respectively sleeved on the guide members. The second surface of the base seat is adapted to be connected to the first end of the first FPC/FFC board, the first surface of the base seat is adapted to be in contact with a first portion of the first FPC/FFC board that is between the first and second ends of the first FPC/FFC board. The sliding member is in contact with a second portion of the first FPC/FFC board that is between the first end and the first portion of the first FPC/FFC board. The sliding member is driven to move along the axis toward the base seat when the second end of the first FPC/FFC board is pulled against a resilient force of the resilient members, and is urged by the resilient force of the resilient members to maintain contact between the first FPC/FFC board and the sliding member and conserve tension of the first FPC/FFC board.

Another object of the disclosure is to provide an electronic apparatus including the abovementioned FPC/FFC tension keeping device.

Accordingly, the electronic apparatus includes a first device part, a second device part rotatably connected to the first device part, a first FPC/FFC board having two opposite first and second ends that are respectively located within the first device part and the second device part, and the FPC/FFC tension keeping device as described above. The first FPC/FFC board wraps around the first surface of the base seat, the sliding member, and the second surface of the base seat.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Figure 1:
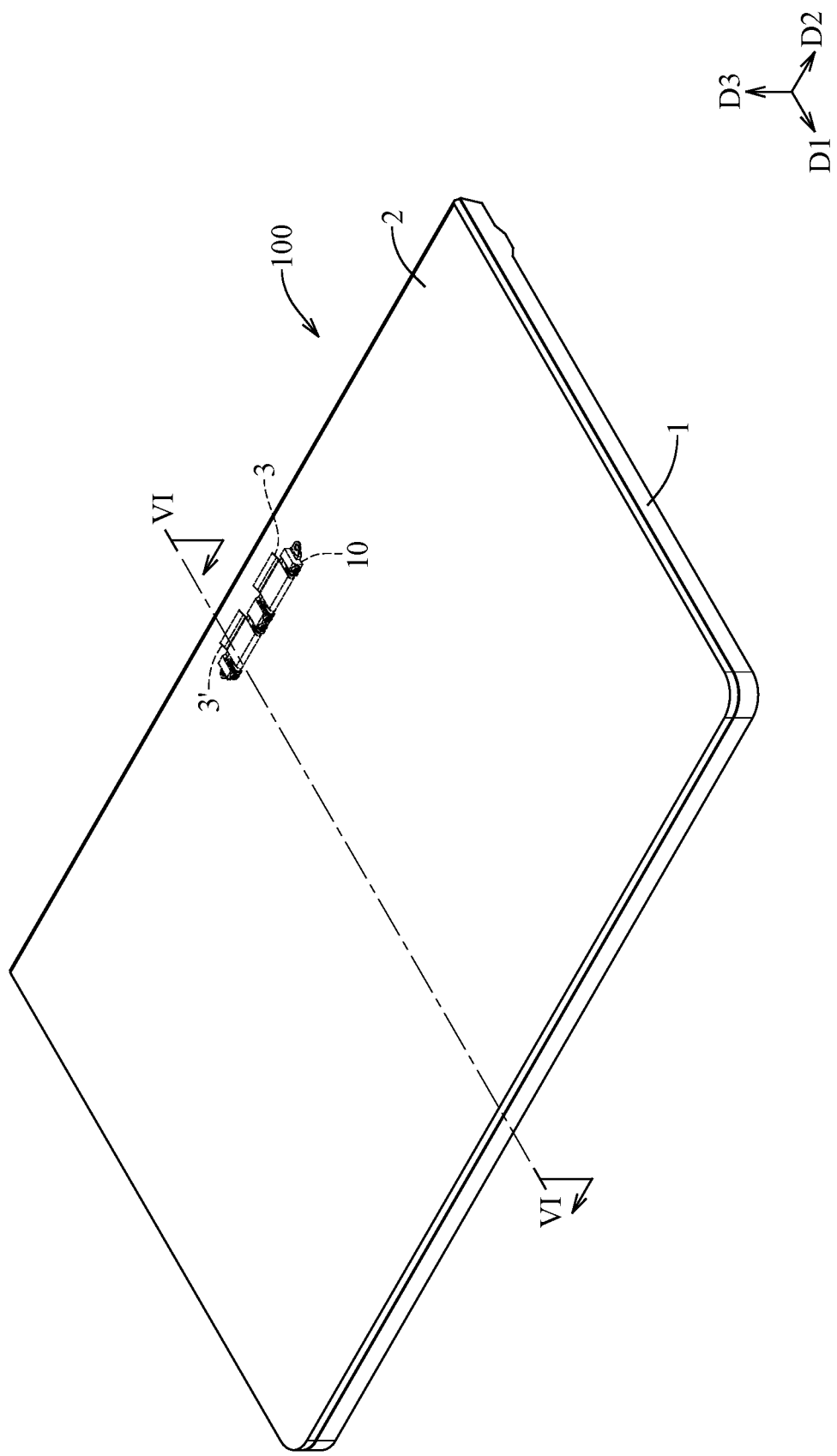
FIG. 1 is a perspective view illustrating an embodiment of an electronic apparatus according to the present disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

It should be noted herein that for clarity of description, spatially relative terms such as "top," "bottom," "upper," "lower," "on," "above," "over," "downwardly," "upwardly" and the like may be used throughout the disclosure while making reference to the features as illustrated in the drawings. The features may be oriented differently (e.g., rotated 90 degrees or at other orientations) and the spatially relative terms used herein may be interpreted accordingly.

Figure 2:
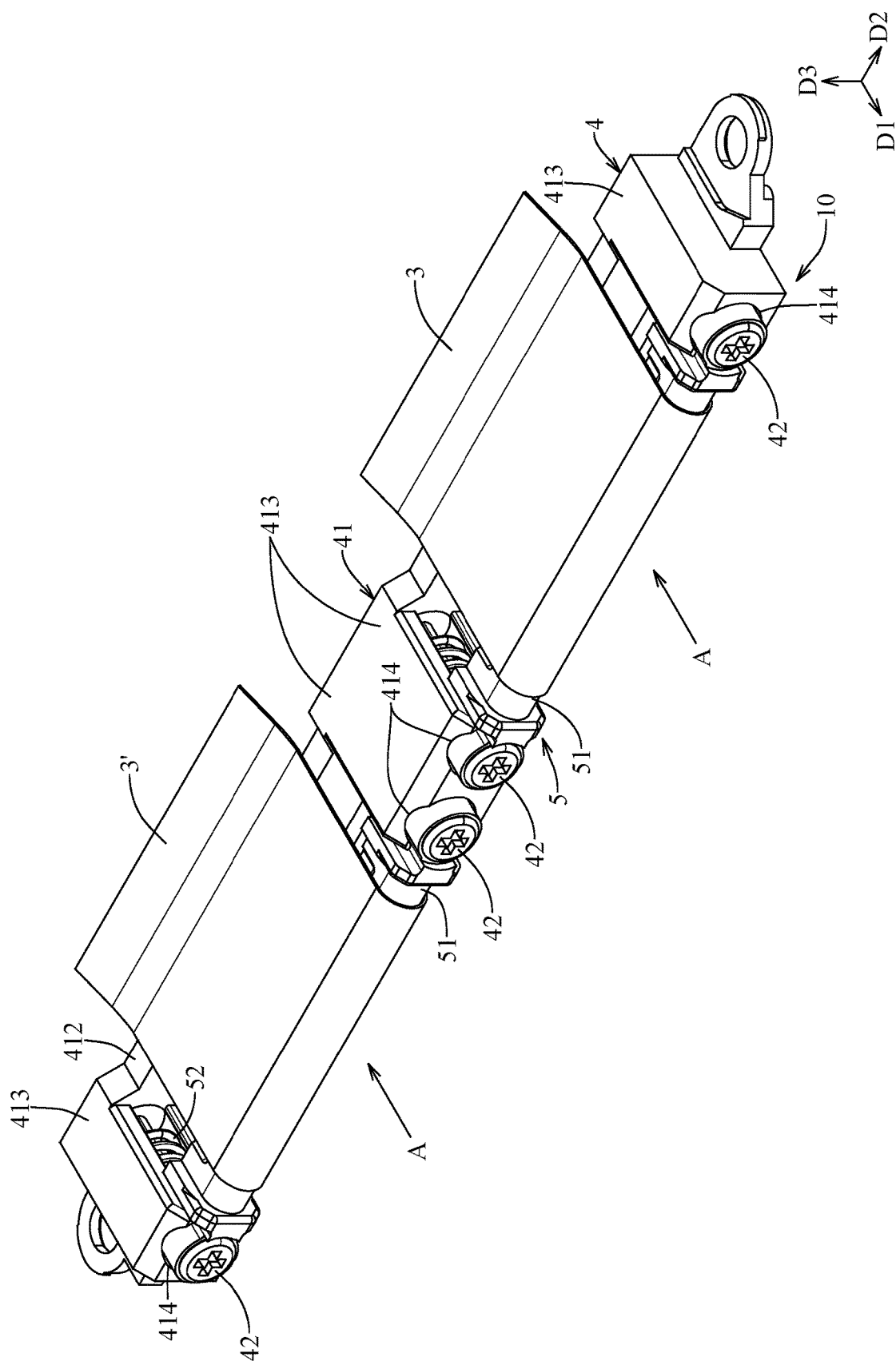
FIG. 2 is a perspective view illustrating an FPC/FFC tension keeping device of the embodiment mounted with first and second FPC/FFC boards.
Figure 3:
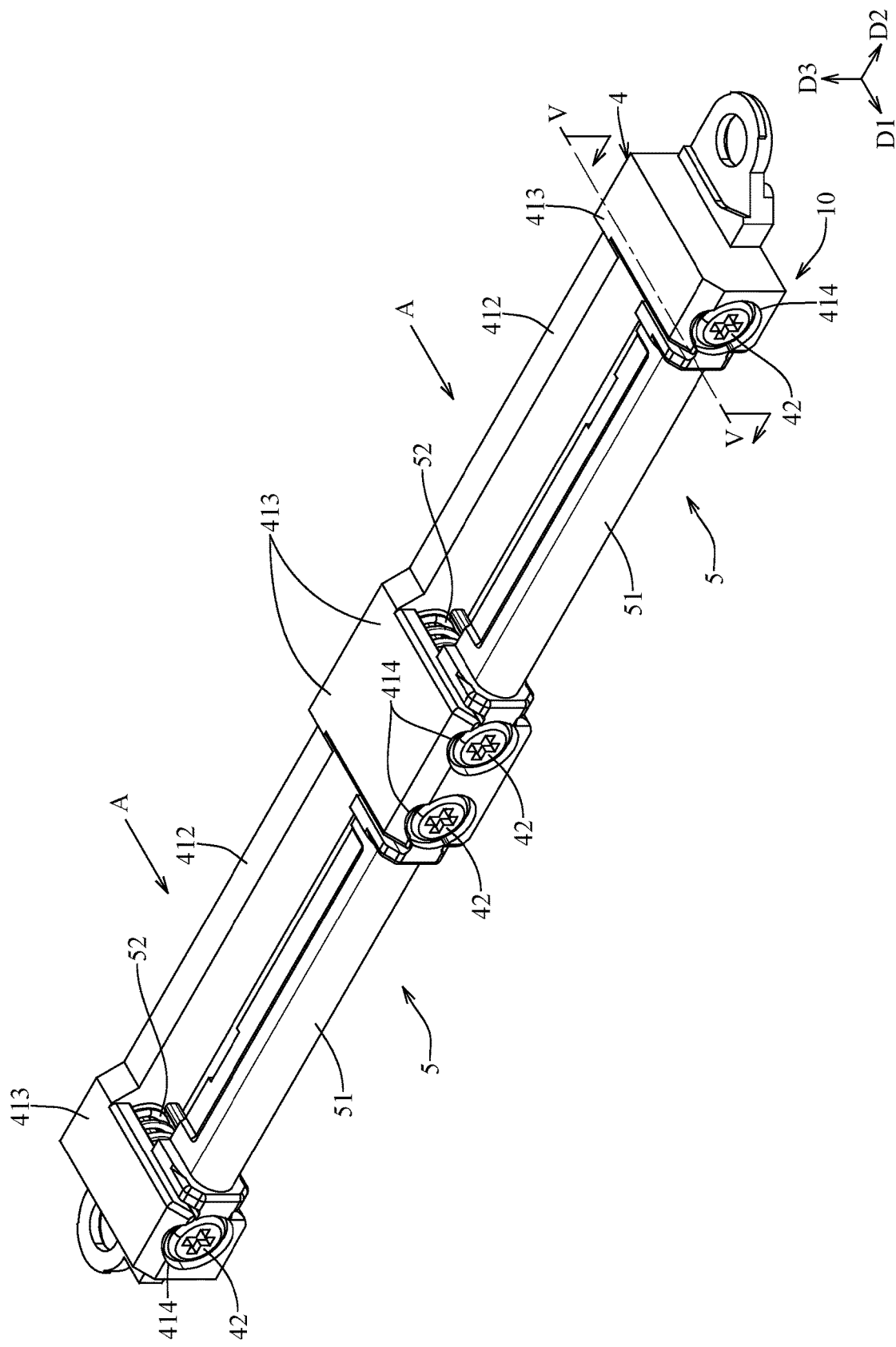
FIG. 3 is an assembled perspective view illustrating the FPC/FFC tension keeping device.
Figure 4:
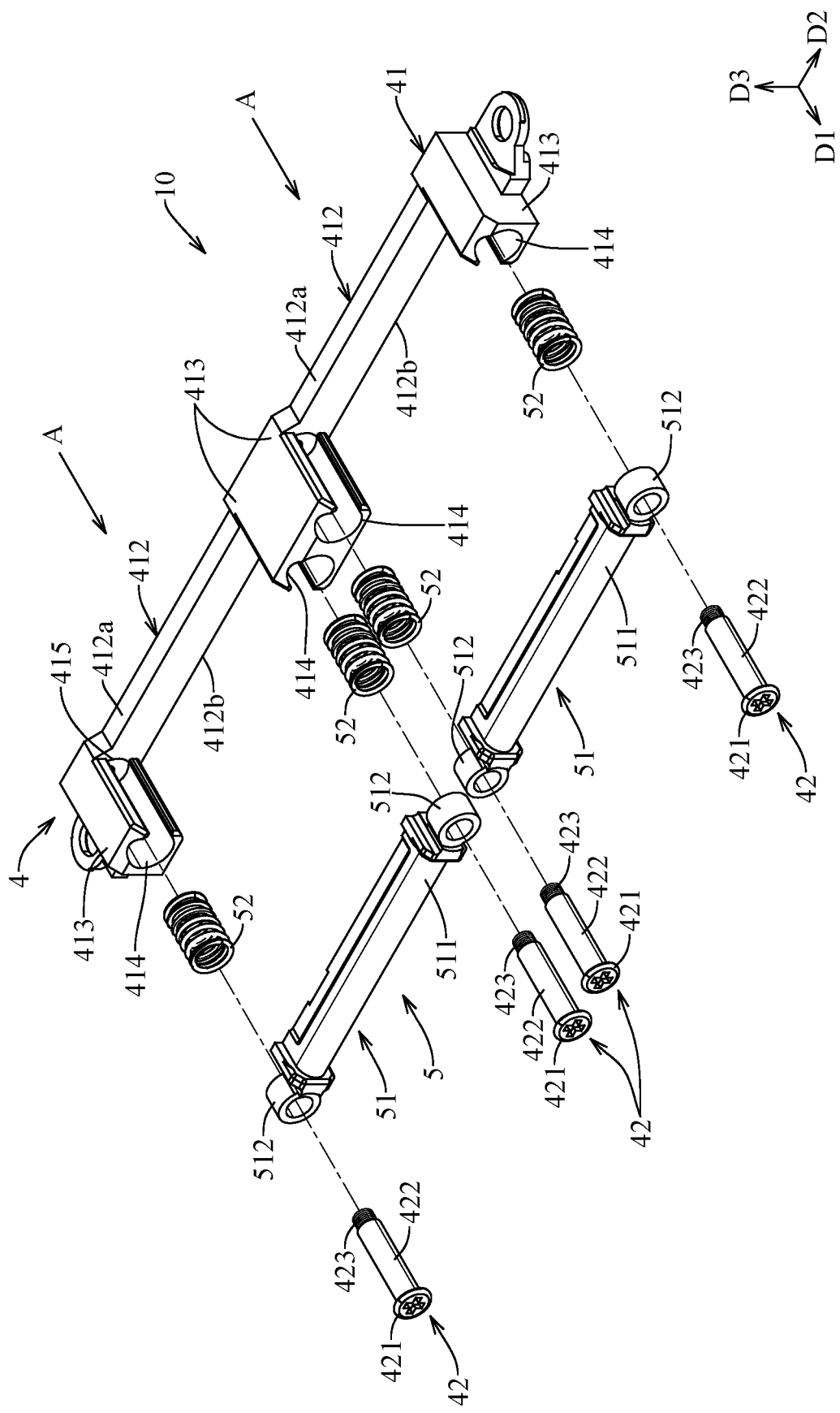
FIG. 4 is an exploded perspective view of the FPC/FFC tension keeping device.
Figure 5:
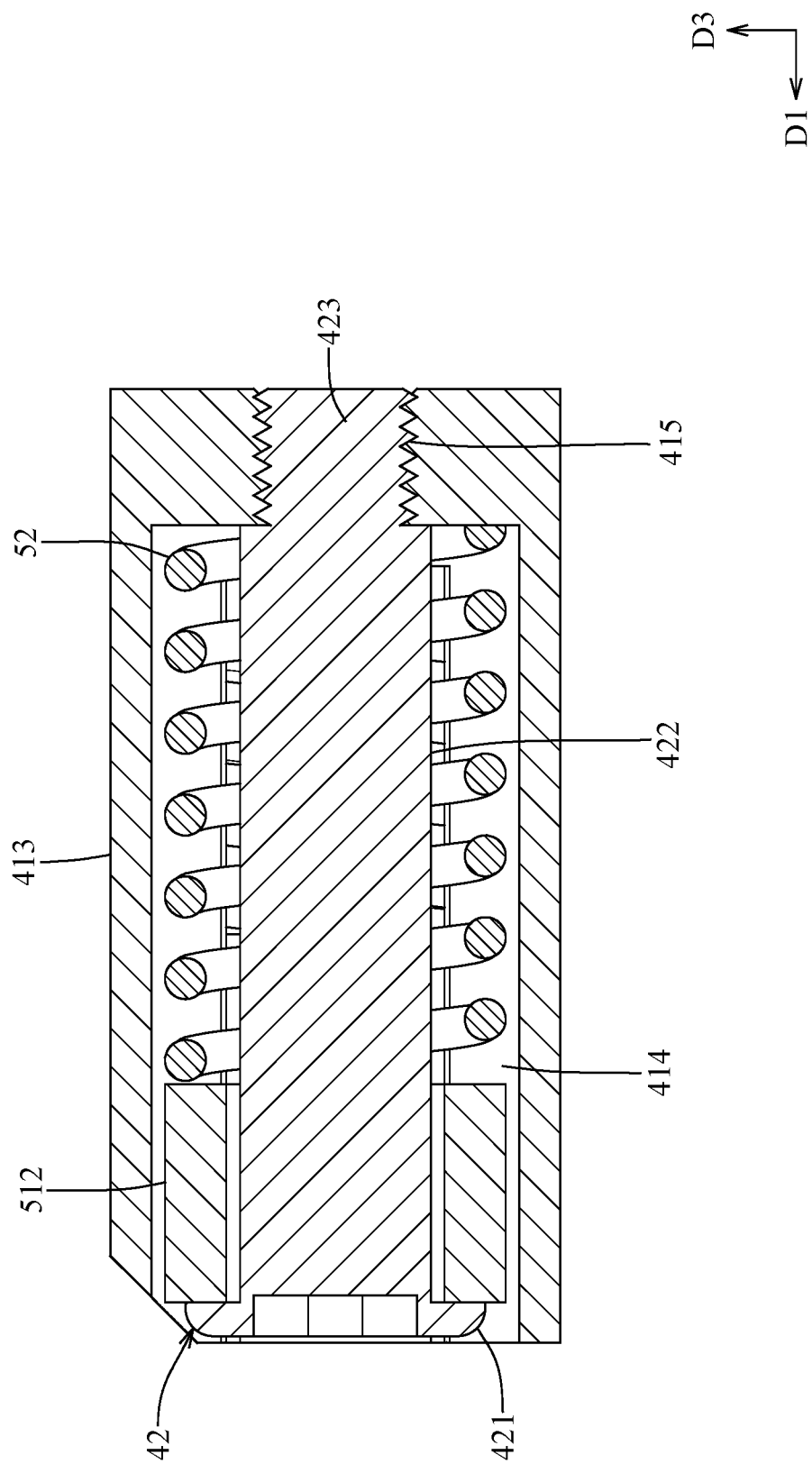
FIG. 5 is a cross-sectional view of one tension keeping unit taken along line V-V in FIG. 3.

Referring to FIGS. 1 to 3, a first embodiment of an electronic equipment 100 according to the present disclosure includes a first device part 1, a second device part 2, a first flexible printed circuit (FPC)/flexible flat cable (FFC) board 3, a second FPC/FFC board 3', and an FPC/FFC tension keeping device 10. In this embodiment, the electronic apparatus 100 is a laptop computer; however, in other embodiments, the electronic apparatus 100 may be a foldable smartphone, a foldable tablet, or other foldable electronic devices. Additionally, it should be noted that other embodiments of the disclosure may not have the second FPC/FFC board 3', and that the disclosure is not limited in the number of FPC/FFC boards as long as there is at least one.

In this embodiment, where the electronic apparatus 100 is exemplified as a laptop computer, the first device part 1 is mounted with a keyboard component, and the second device part 2 is mounted with a display screen. The second device part 2 is rotatably connected to the first device part 1, and can be rotated between a closed position (see FIG. 6) and an open position (see FIG. 8) relative to the first device part. For example, the second device part 2 can be rotatably connected to the first device part 1 via a hinge (not shown).

The first device part 1 and the second device part 2 have various internal electronic components (not shown). The first FPC/FFC board 3 has two opposite first and second ends that are respectively located within the first device part 1 and the second device part 2 to physically and electrically connect the electronic components of the first device part 1 with the electronic components of the second device part 2. Because the first FPC/FFC board 3 is thinner and flatter than conventional electric cables, less space is wasted in the electronic apparatus 100.

The FPC/FFC tension keeping device 10 includes at least one tension keeping unit (A) that includes a base seat module 4 and a sliding module 5. Referring to FIGS. 2 to 5, in this embodiment, the FPC/FFC tension keeping device 10 includes two tension keeping units (A) that are connected respectively to the first FPC/FFC board 3 and the second FPC/FFC board 3' of the electronic apparatus 100. It should be noted that the two tension keeping units (A) are identical, and for the sake of brevity and clarity, the electronic apparatus 100 will be described from the viewpoint of a single tension keeping unit (A) and the first FPC/FCC board 3.

The base seat module 4 includes a base seat 41 and two guide members 42. The base seat 41 includes a connecting plate 412 and two lateral blocks 413, and has two guiding slots 414 and two threaded holes 415. The two guiding slots 414 are respectively formed in the lateral blocks 413 and extend in a first direction (D1). The two lateral blocks 413 are respectively connected to two ends of the connecting plate 412 opposite in a second direction (D2) that is perpendicular to the first direction (D1). The two threaded holes 415 are respectively formed in the lateral blocks 413 and are respectively in spatial communication with the guiding slots 414. The connecting plate 412 of the base seat 41 has a first surface 412a, and a second surface 412b that is opposite to the first surface 412a and that is located below the first surface 412a. A length of the connecting plate 412 in a third direction (D3) that is perpendicular to both the first direction (D1) and the second direction (D2) is greater than a length of the connecting plate 412 in the first direction (D1). The two guide members 42 are respectively inserted in the guiding slots 414 and fixedly connected to the base seat 41. More specifically, each of the two guide members 42 has a head portion 421, a guide rail portion 422 that is connected to the head portion 421 and that extends in the first direction (D1), and a threaded portion 423 that extends from the guide rail portion 422 and that is threadedly connected to a respective one of the threaded holes 415.

Figure 6:
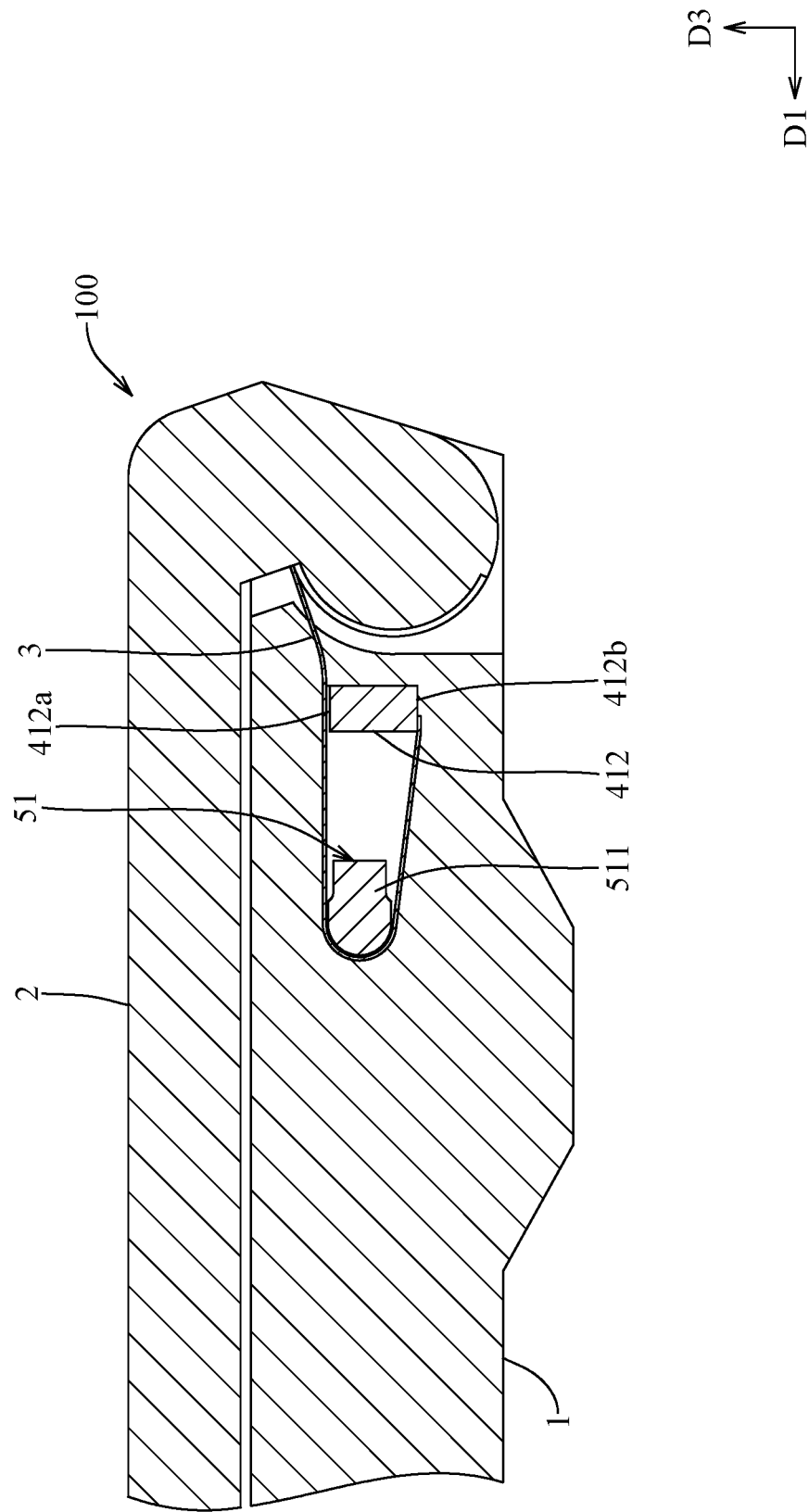
FIG. 6 is a fragmentary cross-sectional view taken along line VI-VI in FIG. 6, showing a second device part of the embodiment in a closed position.
Figure 7:
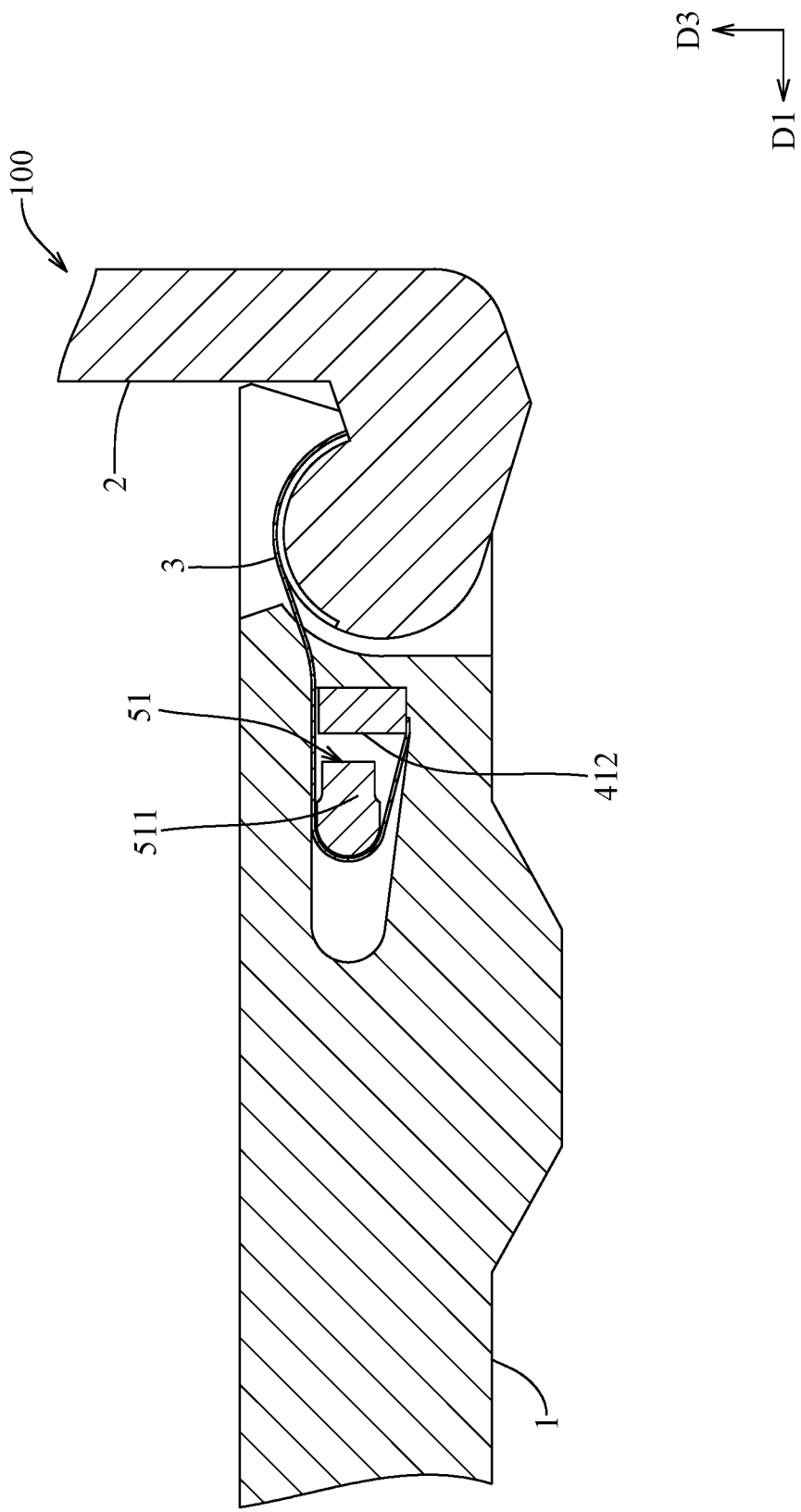
FIG. 7 is a view similar to FIG. 6, showing the second device part being moved toward an open position.

The sliding module 5 includes a sliding member 51 that is elongated in the second direction (D2), that is connected to the guide members 42, and that is slidable along an axis that extends in the first direction (D1), and two resilient members 52 that are respectively disposed in the guiding slots 414 between the base seat 41 and the sliding member 51, and that are respectively sleeved on the guide members 42. The sliding member 51 has a contact portion 511 that is in contact with the first FPC/FFC board 3, and two slide portions 512 that are annular, that are respectively connected to two ends of the contact portion 511 opposite in the second direction (D2), that are respectively slidably sleeved on the guide members 42, and that respectively abut against the resilient members 52. Referring to FIG. 6, the first FPC/FFC board 3 wraps around the first surface 412a of the base seat 41, the contact portion 511 of the sliding member 51, and the second surface 412b of the base seat 41. The contact portion 511 of the sliding member 51 has a rounded profile designed for contacting the first FPC/FFC board 3 whilst reducing friction, thereby preventing damage and reducing wear on the first FPC/FFC board 3 which may increase service life. The slide portions 512 (see FIG. 4) of the sliding member 51 are respectively slidably sleeved on the guide rail portions 422 of the guide members 42. It should be noted that the head portions 421 of the guide members 42 have a larger diameter compared to the guide rail portions 422 of the guide members 42. Additionally, the head portion 421 of each of the guide members 42 has a larger diameter than the respective one of the slide portions 512, and this larger diameter helps to restrain the respective one of the two slide portions 512, preventing the slide portion 512 from sliding out the respective one of the guiding slots 414. In this embodiment, the resilient members 52 are compression springs that respectively abut against the slide portions 512 of said sliding member 51.

Figure 8:
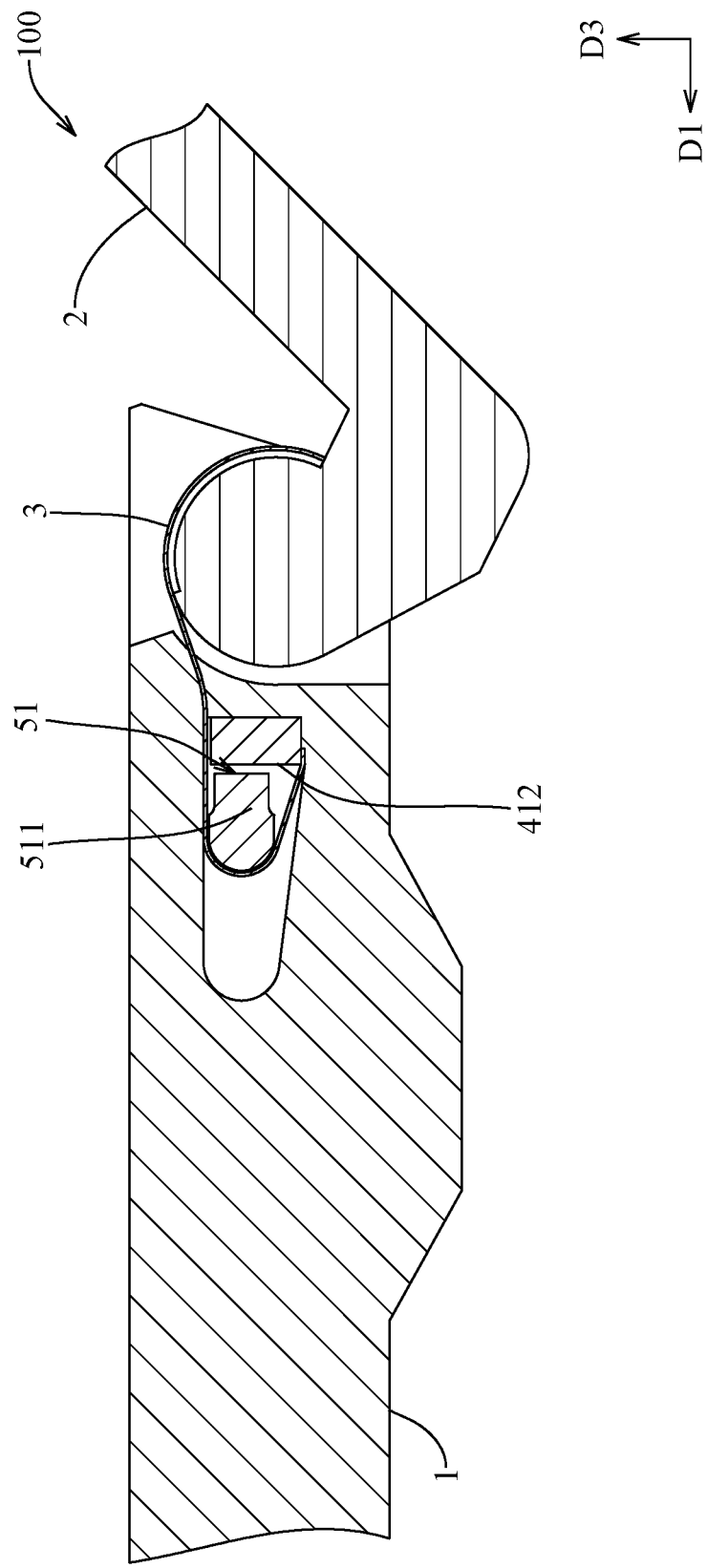
FIG. 8 is a view similar to FIG. 6, showing the second device part in the open position.

Referring to FIGS. 2, 6 and 8, the second surface 412b of the base seat 4 is connected to the first end of the first FPC/FFC board 3, the first surface 412a of the base seat 4 is in contact with a first portion of the first FPC/FFC board 3 that is between the first and second ends of the first FPC/FFC board 3, and the sliding member 51 is in contact with a second portion of the first FPC/FFC board 3 that is between the first end and the first portion of the first FPC/FFC board 3. The sliding member 51 is driven to move along the axis that extends in the first direction (D1) toward the base seat 41 when the second end of the first FPC/FFC board 3 is pulled against a resilient force of the resilient members 52, and is urged by the resilient force of the resilient members 52 to maintain contact between the first FPC/FFC board 3 and the sliding member 51 and conserve tension of the first FPC/FFC board 3. More specifically, when a user opens the electronic apparatus 100, the second device part 2 is moved from the closed position to the open position, the second end of the first FPC/FFC board 3 will be pulled by the second device part 2 which drives the sliding member 51 to move toward the connecting plate 412 of the base seat 41. At this point, the resilient members 52 is compressed and exerts a resilient force on the sliding member 51 to maintain contact between the first FPC/FFC board 3 and the sliding member 51 and to thereby conserve tension of the first FPC/FFC board 3. When the user closes the electronic apparatus 100, the second device part 2 is moved from the open position to the closed position, the second device part 2 gradually releases the stored tension of the first FPC/FFC board 3, and the resilient force from the resilient members 52 will gradually return the first FPC/FFC board 3 and the sliding member 51 while maintaining tension in the first FPC/FFC board 3. In summary of the above, the tension in the first FPC/FCC board 3 can be maintained when the electronic apparatus 100 is opened or closed by the user, and the first FPC/FFC board 3 may be prevented from being overly stretched out or excessively loosened such that creasing and crimping of the first FPC/FFC board 3 may happen. Additionally, during the opening and closing of the electronic apparatus 100, the movement and subsequent return of the first FPC/FCC board 3 is smooth and even. It should be noted that, in order to ensure that the first FPC/FFC board 3 has sufficient travel, the sliding member 51 and the connecting plate 412 should be spaced apart by an appropriate distance which matches the length of travel of the first FPC/FFC board 3.

It should noted that, even though the above examples are described from the viewpoint of a single tension keeping unit (A) and the first FPC/FFC board 3, the first embodiment includes, in fact, two tension keeping units (A) in the FPC/FFC tension keeping device 10. In the first embodiment, the base seats 41 of the tension keeping units (A) are juxtaposed with each other. More specifically, one of the lateral blocks 413 of one of the base seats 41 and an adjacent one of the lateral blocks 413 of the other one of the base seats 41 are conjoined in one piece.

The structure of the FPC/FFC tension keeping device 10 according to the disclosure is simple, the number of the component is small, while still being able to maintain tension in the first FPC/FFC board 3 during return movement of the first FPC/FFC board 3, and having the advantage of easy assembly. Compared with the flexible sheath module that is conventionally used on similar electronic equipment, the FPC/FFC tension keeping device 10 is more cost effective since it does not require costly materials.

Figure 9:
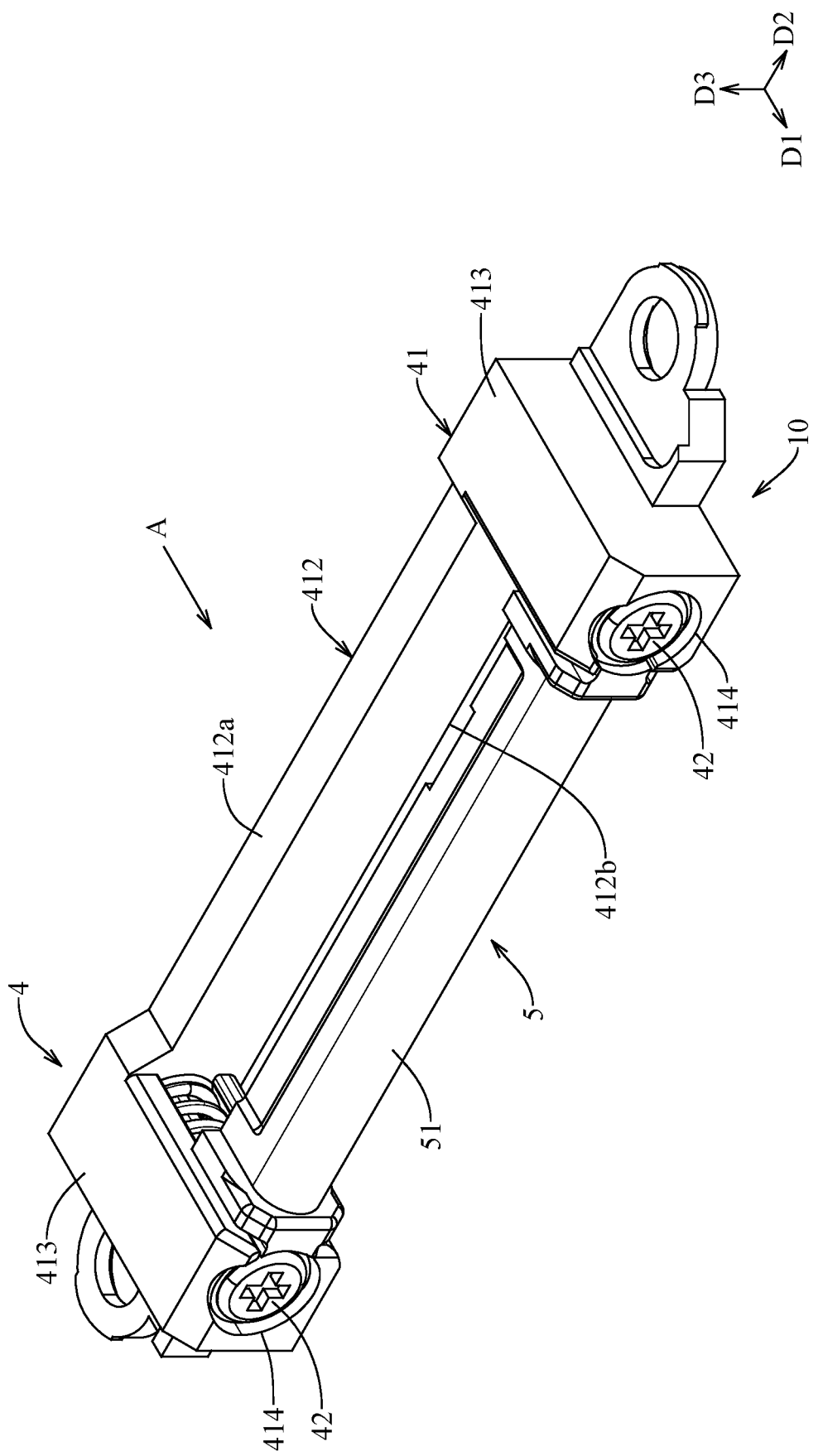
FIG. 9 is a perspective view of a second embodiment of the electronic apparatus according to the present disclosure.

Referring to FIG. 9, a second embodiment of the electronic apparatus 100 is shown. The second embodiment is similar to the first embodiment; however, in the second embodiment, the FPC/FFC tension keeping device 10 includes only one tension keeping device (A).

In summary of the above, by virtue of the sliding module 5 including the sliding member 51 being slidable, when the first FPC/FFC board 3 is pulled by the second device part 2 against the resilient force of the resilient members 52, the sliding member 51 is driven to move toward the base seat 41, and is urged by the resilient force of the resilient members 52 to maintain contact between the first FPC/FFC board 3 and the sliding member 41 and conserve tension of the first FPC/FFC board 3. The FPC/FFC tension keeping device 10 according to the present disclosure has less components parts and a streamlined structure to facilitate assembly, and is more cost effective than the flexible sheath module which requires costly materials to manufacture.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is(are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. An FPC/FFC tension keeping device adapted to be mounted to an electronic apparatus, the electronic apparatus including a first device part, a second device part that is rotatably connected to the first device part, and a first FPC/FFC board, the first FPC/FFC board having two opposite first and second ends that are respectively located within the first device part and the second device part, said FPC/FFC tension keeping device comprising:
at least one tension keeping unit including
a base seat module that includes a base seat and two guide members, said base seat having a first surface, a second surface that is opposite to said first surface, and two guiding slots that extend in a first direction, said two guide members being respectively inserted in said guiding slots and fixedly connected to said base seat, and
a sliding module that includes a sliding member being elongated in a second direction that is perpendicular to the first direction, being connected to said guide members, and being slidable along an axis that extends in the first direction, and two resilient members being respectively disposed in said two guiding slots and respectively sleeved on said guide members;
wherein said second surface of said base seat is adapted to be connected to the first end of the first FPC/FFC board, said first surface of said base seat is adapted to be in contact with a first portion of the first FPC/FFC board that is between the first and second ends of the first FPC/FFC board, and said sliding member (51) is in contact with a second portion of the first FPC/FFC board that is between the first end and the first portion of the first FPC/FFC board; and wherein said sliding member is driven to move along the axis toward said base seat when the second end of the first FPC/FFC board is pulled against a resilient force of said resilient members, and is urged by the resilient force of said resilient members to maintain contact between the first FPC/FFC board and said sliding member and conserve tension of the first FPC/FFC board.

2. The FPC/FFC tension keeping device as claimed in claim 1, wherein said sliding member has a contact portion that is adapted to be in contact with the first FPC/FFC board, and two slide portions that are annular, that are respectively connected to two ends of said contact portion opposite in the second direction, that are respectively slidably sleeved on said guide members, and that respectively abut against said resilient members.

3. The FPC/FFC tension keeping device as claimed in claim 2, wherein said base seat includes a connecting plate that has said first and second surfaces, and two lateral blocks that are respectively connected to two ends of said connecting plate opposite in the second direction, and that are respectively formed with said two guiding slots.

4. The FPC/FFC tension keeping device as claimed in claim 2, wherein said base seat further has two threaded holes that are respectively in spatial communication with said guiding slots, each of said two guide members having a head portion, a guide rail portion that is connected to said head portion and that extends in the first direction, and a threaded portion that extends from said guide rail portion and that is threadedly connected to a respective one of said threaded holes, said slide portions of said sliding member being respectively slidably sleeved on said guide rail portions of said guide members, said head portion of each of said guide members restraining the respective one of said two slide portions and preventing said slide portion from sliding out of the respective one of said guiding slots.

5. The FPC/FFC tension keeping device as claimed in claim 3, wherein said at least one tension keeping unit includes two tension keeping units adapted to be connected respectively to the first FPC/FFC board and a second FPC/FFC board of the electronic apparatus, said base seats of said tension keeping units being juxtaposed with each other, one of said lateral blocks of one of said base seats and an adjacent one of said lateral blocks of the other one of said base seats being conjoined in one piece.

6. An electronic apparatus comprising:
a first device part;
a second device part rotatably connected to said first device part;
a first FPC/FFC board having two opposite first and second ends that are respectively located within said first device part and said second device part; and
an FPC/FFC tension keeping device as claimed in claim 1, said first FPC/FFC board wrapping around said first surface of said base seat, said sliding member, and said second surface of said base seat.

7. The electronic apparatus as claimed in claim 6, wherein said sliding member has a contact portion that is in contact with said first FPC/FFC board, and two slide portions that are annular, that are respectively connected to two ends of said contact portion opposite in the second direction, and that are respectively slidably sleeved on said guide members, and that respectively abut against said resilient members.

8. The electronic apparatus as claimed in claim 7, wherein said base seat includes a connecting plate that has said first and second surfaces, and two lateral blocks that are respectively connected to two ends of said connecting plate opposite in the second direction, and that are respectively formed with said two guiding slots.

9. The electronic apparatus as claimed in claim 7, wherein said base seat further has two threaded holes that are respectively in spatial communication with said guiding slots, each of said two guide members having a head portion, a guide rail portion that is connected to said head portion and that extends in the first direction, and a threaded portion that extends from said guide rail portion and that is threadedly connected to a respective one of said threaded holes, said slide portions of said sliding member being respectively slidably sleeved on said guide rail portions of said guide members, said head portion of each of said guide members restraining the respective one of said two slide portions and preventing said slide portion from sliding out of the respective one of said guiding slots.

10. The electronic apparatus as claimed in claim 8, further comprising a second FPC/FFC board, said at least one tension keeping unit includes two tension keeping units connected respectively to said first and second FPC/FFC boards, said base seats of said tension keeping units being juxtaposed with each other, one of said lateral blocks of one of said base seats and an adjacent one of said lateral blocks of the other one of said base seats being conjoined in one piece.

* * * * *